(12) United States Patent
Hennings et al.

(10) Patent No.: US 11,105,768 B2
(45) Date of Patent: Aug. 31, 2021

(54) ELECTROCHEMICAL SENSOR WITH EXCHANGEABLE ELECTRODE ASSEMBLY

(71) Applicant: Endress+Hauser Conducta GmbH+Co. KG, Gerlingen (DE)

(72) Inventors: Erik Hennings, Freiberg (DE); Jens Vettermann, Großweitzschen (DE); Christian Fanselow, Geringswalde (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 901 days.

(21) Appl. No.: 15/615,929

(22) Filed: Jun. 7, 2017

(65) Prior Publication Data
US 2017/0356871 A1 Dec. 14, 2017

(30) Foreign Application Priority Data
Jun. 14, 2016 (DE) ...................... 10 2016 110 856.1

(51) Int. Cl.
*G01N 27/416* (2006.01)
*C23C 14/04* (2006.01)
(Continued)

(52) U.S. Cl.
CPC .......... *G01N 27/416* (2013.01); *C23C 14/048* (2013.01); *C23C 14/24* (2013.01); *G01N 27/414* (2013.01); *G01N 27/4166* (2013.01)

(58) Field of Classification Search
CPC ............. G01N 27/416; G01N 27/4166; G01N 27/414; G01N 27/31; G01N 27/30; C23C 14/048; C23C 14/24
See application file for complete search history.

(56) References Cited

U.S. PATENT DOCUMENTS 10,436,729 B2 * 10/2019 Fanselow ............ G01R 31/2829
2003/0089623 A1 * 5/2003 Peat ........................ G01N 27/38
205/775
(Continued)

FOREIGN PATENT DOCUMENTS

CN 101147056 A 3/2008
CN 203606314 U 5/2014
(Continued)

OTHER PUBLICATIONS

L. Holhjem, et al., "Development of a Conductometric Biocompatible Sensor for Detecting Ischemia" In 2013 European Microelectronics Packaging Conference IEEE, pp. 1-4, Sep. 2013.*
(Continued)

*Primary Examiner* — J. Christopher Ball
(74) *Attorney, Agent, or Firm* — Christopher R. Powers; Endress+Hauser (USA) Holding Inc.

(57) ABSTRACT

The present disclosure relates to a method for producing an exchangeable electrode assembly, with at least one sensor body and at least a first electrode, for an electrochemical sensor for determining the concentration of an analyte in a gaseous or liquid measurement medium, a corresponding electrode assembly, and an electrochemical sensor with an electrode assembly according to the present disclosure. In order to produce the electrode assembly, the following method steps are performed: providing a sensor body, and applying at least a first electrically-conductive material to a first sub-region of the sensor body for producing a first electrode of the electrode assembly.

7 Claims, 4 Drawing Sheets

(51) Int. Cl.
*C23C 14/24* (2006.01)
*G01N 27/414* (2006.01)

(56) References Cited

U.S. PATENT DOCUMENTS

| | | | |
|---|---|---|---|
| 2008/0171181 | A1 | 7/2008 | Zaderej |
| 2010/0122905 | A1 | 5/2010 | De Coulon et al. |
| 2010/0321046 | A1 | 12/2010 | Randall et al. |
| 2012/0090995 | A1* | 4/2012 | Leonard ............ G01N 27/4167 204/406 |

FOREIGN PATENT DOCUMENTS

| | | |
|---|---|---|
| CN | 204439591 U | 7/2015 |
| DE | 102008039465 A1 | 3/2010 |
| DE | 202011101241 U1 | 10/2011 |
| DE | 102012111811 A1 | 6/2014 |
| DE | 102013013601 A1 | 3/2015 |
| DE | 102014109995 A1 | 1/2016 |
| WO | 2010023067 A1 | 3/2010 |
| WO | 2016008908 A1 | 1/2016 |

OTHER PUBLICATIONS

L. Holhjem, et al., "Electrode Composition for Laser Patterned Conductometric Sensors", In Proceedings of the 5th Eelctronics System-integration Technology Conference, IEEE, pp. 1-6, Sep. 2014.*

Design Guide for Vectra® LCP produced by Celanese; https://www.celanese.com/-/media/Engineered%20Materials/Files/Product%20Technical%20Guides/LCP-027_VectraLCPDesignGuideTG_AM_0613.pdf; (C) (Year: 2013).*

Search Report for German Patent Application No. 10 2016 110 856.1, German Patent Office, dated Jun. 13, 2017, 7 pp.

* cited by examiner

ELECTROCHEMICAL SENSOR WITH EXCHANGEABLE ELECTRODE ASSEMBLY

CROSS-REFERENCE TO RELATED APPLICATION

The present application is related to and claims the priority benefit of German Patent Application No. 10 2016 110 856.1, filed Jun. 14, 2016, the entire contents of which are incorporated herein by reference.

TECHNICAL FIELD

The present disclosure relates to a method for producing an exchangeable electrode assembly for an electrochemical sensor for determining the concentration of an analyte in a gaseous or liquid medium, to a corresponding electrode assembly, and to an electrochemical sensor with an electrode assembly according to the present disclosure.

BACKGROUND

In analytical measurement technology, especially in the field of water management, environmental analysis, in the industrial sector, e.g., in food technology, biotechnology, and pharmacy, as well as for the most varied laboratory applications measurands, like the pH value or the concentration of analytes, such as ions or dissolved gases in a gaseous or liquid measurement medium, are of vital importance. These measurands can be detected and/or monitored by means of electrochemical sensors, such as potentiometric, amperometric, voltammetric, or even coulometric sensors, which are all per se known from the prior art.

Electrochemical sensors are often designed in the form of measuring probes with an immersed region for immersing the measuring probe in the respective measurement medium. An electronics unit, which can, for example, be arranged together with the sensor or spatially separated from it, further serves to supply, detect, and/or evaluate signals. If necessary, the electronics unit can also be connected to a higher-level unit, such as a measuring transducer, a computer, or a process control system.

Potentiometric sensors often comprise, for example, at least one measuring half-cell with an inner electrolyte and a reference half-cell with a reference electrolyte. A difference in potential arising in contact with the measurement medium between a lead electrode of the measuring half-cell and a reference electrode of the reference half-cell is used to determine the respective measurand. In a region intended for immersion in the measurement medium, the reference half-cell has an electrochemical bridge (e.g., an opening also called a liquid junction or a porous diaphragm), and the measuring half-cell has a membrane for establishing an electrical contact between the lead electrode or the reference electrode and the respective measurement medium. In the case of a pH sensor, the measuring half-cell comprises, again, a glass membrane, for example, at which a potential dependent upon the pH value difference between the inner electrolyte and the measurement medium arises. However, in the case of ion-selective electrodes (ISE), the membrane is often a polymer or ceramic membrane, which contains an ionophore, and at which, accordingly, a potential dependent sufficiently selectively upon the concentration of the ion to be determined in the measurement medium arises.

Amperometric sensors, on the other hand, comprise at least two electrodes, of which one serves as working electrode and one as counter electrode. The respective measurand is determined on the basis of a current flow through the working electrode. Often, the potential of the counter electrode in relation to the working electrode or the current flow through the working electrode is regulated by means of a third, non-current-carrying reference electrode.

Electrochemical sensors thus basically have at least one electrode, which is brought into contact with a measurement medium in order to determine the concentration of an analyte and/or the pH value in a measurement medium on the basis of, for example, the current flow detected by means of the electronics unit or, potentiometrically, on the basis of a potential difference arising between two electrodes. For many applications, the electrodes are brought into electrolytic contact with the respective measurement medium by means of a chamber filled with an electrolyte, such that an ion flow is possible. For this purpose, the chamber is delimited in the region facing the medium, hereafter also called the medium side, by a membrane that is transparent to the respective analyte or to a reaction product of the analyte, or by an electrolytic bridge. If the respective electrode is connected as an anode or cathode, the analyte is consequently oxidized or reduced, respectively.

For many conventional sensors, the at least one electrode is a thick-walled component, which can also take on mechanical functions in addition to the measuring function. The electrode(s) are in this case often produced from metals or metal alloys, e.g., precious metals, such as copper, silver, gold, or platinum. The high material requirements resulting from the solid construction, especially in the case of precious metals, constitute a significant expense in the production of the respective sensor.

SUMMARY

The present disclosure is therefore based upon the aim of providing a cost-effective electrochemical sensor.

This aim is achieved by a method for producing an exchangeable electrode assembly for an electrochemical sensor, by a correspondingly produced electrode assembly, and by an electrochemical sensor with an electrode assembly according to the present disclosure.

With respect to the method, the aim is achieved by a method for producing an exchangeable electrode assembly, with at least one sensor body and at least a first electrode, for an electrochemical sensor for determining the concentration of an analyte in a gaseous or liquid measurement medium, comprising the following method steps: providing a sensor body and applying a first electrically-conductive material to a first subregion of the sensor body for producing a first electrode of the electrode assembly.

The electrically-conductive material used for producing at least one electrode is applied to the sensor body in the form of a coating. For this method step, various possibilities, which are partially described in the exemplary embodiments mentioned below and which all fall under the present disclosure, are available to the person skilled in the art.

The method according to the present disclosure, especially the provision of electrodes in the form of thin layers on a sensor body on the one hand advantageously allows a miniaturization of the respective sensor. The number of components and assembly steps, as well as the consumption of materials, especially with respect to the precious metals are, furthermore, significantly reduced compared to traditional production methods. In addition to a savings in cost, the present disclosure also, consequently, significantly reduces the production expenditure.

The produced electrode assemblies are suitable for so-called single-use applications. For a new application, the electrode assembly can simply be exchanged by means of the mounting unit, which constitutes another advantage of the present disclosure.

According to an embodiment of the method according to the disclosure, the sensor body is designed such that it has at least a first mounting unit for removably mounting the electrode assembly on at least one component of the electrochemical sensor.

Many traditional, conventional sensors have a sensor tube, on or in which the exchangeable electrode assembly according to the present disclosure can then preferably be removably mounted. All removable mounting means known to the person skilled in the art, such as plug-in connections, or screw connections, but also bayonet connectors, magnetic connectors, or hook connectors, are conceivable in this respect. Depending upon the selected mounting means, the sensor tube can, in turn, optionally further have a second mounting unit complementary to the first mounting unit of the electrode assembly. It goes without saying that the electrode assembly according to the present disclosure can also be mounted on other components of an electrochemical sensor, depending upon the design of the sensor.

According to the present disclosure, the mounting unit is introduced onto or into the sensor body. For example, the mounting unit can subsequently be mounted on the sensor body. The addition of a mounting unit can, however, also be integrated into the respective production method, so that the mounting unit is also produced during the production of the sensor body. For example, the mounting unit can be produced to be at least partially integrated with the sensor body within the scope of a single- or multi-component casting method, by insert molding, or by other common mounting methods known to the person skilled in the art, such as gluing, welding, or similar means.

According to an embodiment of the method, the sensor body is produced from a non-conductive material, including a plastic or a ceramic.

Another embodiment of the method involves a structure, such as a lattice structure or a profile being introduced at least into a segment of the sensor body during or after the production of the sensor body. The structure is at least partially or completely arranged in the region of at least one of the subregions of the sensor body. It can, for example, serve as a spacer or placeholder between the membrane and the respective electrode, e.g., a measuring electrode of an electrochemical sensor in a section referred to as a measuring chamber inside the sensor.

In an embodiment of the method, at least one additional electrode is applied to another subregion of the sensor body.

An electrode assembly according to the present disclosure can thus either have a single electrode, or several electrodes can be applied to the sensor body. Depending upon the number of electrodes, either one or several subregions, not electrically connected with one another, along the surface of the sensor body are defined, to which subregions the electrode(s) are subsequently applied. The electrically-conductive material used for the production or manufacture of the electrodes can in this case be different for all electrodes or for at least two electrodes.

The subregions can furthermore be simple, connected regions on a surface of the sensor body. A subregion can, however, also be composed of two regions that are not directly connected to one another but are separately in contact.

It is advantageous for the at least one electrode to be applied to the sensor body by means of galvanization, by means of a chemical deposition, including one based upon a redox reaction by means of the chemical vapor deposition (CVD) method, by means of the physical vapor deposition (PVD) method, or by means of fire gilding.

Alternatively, one embodiment of the method involves the electrode assembly being produced in the form of an injection-molded circuit carrier also called a molded interconnect device. For the production of an injection-molded circuit carrier, many different methods can be used, such as various two-component casting methods, hot embossing methods, laser-based methods, mask-lighting methods, or even back injection molding methods, the basic principles of which are known from the prior art.

According to an embodiment, the so-called laser direct structuring (LDS) method is applied, which constitutes a particularly preferred variant for the production of injection-molded circuit carriers or molded interconnect devices (MID for short).

In this case, the method according to the present disclosure comprises the following method steps: providing the sensor body made of a plastic, which sensor body is doped with a laser-activatable metal compound as plastic additive, structuring the doped sensor body by means of a laser at least in a first subregion, so that conductive metal particle seeds are generated from the metal compound, and at least partially galvanizing the sensor body in the first subregion by means of a first electrically-conductive material for producing the first electrode of the electrode assembly.

For the laser direct structuring (LDS) method, which is, for example, described in DE 102012106319A1 or even in the not-yet-published patent application with application number DE 102015121857.7, a thermoplastic resin doped with a non-conducting, laser-activatable metal compound as plastic additive is used. The final conductor paths or electrodes are first written onto the plastic by means of a suitable laser beam. In the regions exposed directly to the laser light, the plastic matrix is decomposed on the surface into volatile fission products, i.e., slightly removed. At the same time, metal seeds are separated from the additive, which metal seeds are located in a finely distributed manner in the micro-rough surface. These metal particles form the seeds for the subsequent metallization. The metallization can take place in one or several successive, especially electrodeless, metal baths, in which the individual conductor path layers are produced with high precision in the course of a galvanization in the regions exposed directly to the laser. Thin layers of different materials, such as copper, nickel, or gold, can thus be applied successively. Compared to traditional metallic electrodes, the material consumption required for performing the method according to the present disclosure is much lower.

The aim according to the present disclosure is further achieved by an electrode assembly for an electrochemical sensor for determining the concentration of an analyte in a gaseous or liquid measurement medium, which electrode assembly is produced according to at least one embodiment of the method according to the present disclosure.

In an embodiment, the electrode assembly has at least one first electrode assembly contacting unit for removably, electrically contacting at least the first electrode to at least one component of the electrochemical sensor. By means of the electrical first electrode assembly contacting unit, an electrical connection can thus be established between the electrode assembly and the rest of the sensor. For the electrode assembly contacting unit, all contacting possibilities customary for the person skilled in the art are conceivable. The at least one electrode can, for example, be contacted from the outside by means of a wire or using metallized contact feedthroughs, which extend at least partially through the sensor body.

In another embodiment, the electrode assembly has a structure, including a lattice structure or a profile.

Finally, the aim according to the present disclosure is achieved by an electrochemical sensor for determining the concentration of an analyte in a gaseous or liquid measurement medium, by means of an electrolyte chamber, which is separated from the measurement medium by a membrane and at least partially filled with an electrolyte, and an electrode assembly according to the present disclosure, wherein the at least first electrode of the electrode assembly protrudes into the electrolyte chamber such that it is in contact with the electrolyte at least partially.

According to an embodiment, at least one component, particularly a housing of the electrochemical sensor, has a second mounting unit, which is designed to be complementary to the first mounting unit of the electrode assembly, and wherein the electrode assembly is removably mountable on the sensor by means of the first and second mounting units. The first and second mounting units of the electrochemical sensor are designed to be complementary to one another.

Another embodiment involves the electrochemical sensor further comprising at least a second contacting unit for electrically contacting the electrode assembly to an electronics unit of the sensor. The electrode assembly and the electronics unit of the sensor can, in principle, be put into electrical contact with one another in many different ways. In this case as well, the person skilled in the art once again, in principle, has all known possibilities for establishing an electrical contact available. For example, the second contacting unit can be designed to be complementary to the first contacting unit of the electrochemical sensor.

It is, ultimately, advantageous for the electrochemical sensor to have an electrode assembly with a structure, wherein the electrode assembly is arranged such that at least a portion of the section, which features a structure, of the edge region of the electrode assembly faces the membrane.

It should be pointed out that the embodiments mentioned in connection with the method according to the present disclosure, the electrode assembly according to the present disclosure, and the electrochemical sensor according to the present disclosure can be applied mutatis mutandis to one another.

BRIEF DESCRIPTION OF THE DRAWINGS

The present disclosure is explained in more detail below with reference to FIGS. 1 through 4. These show.

DETAILED DESCRIPTION

Figure 1A:
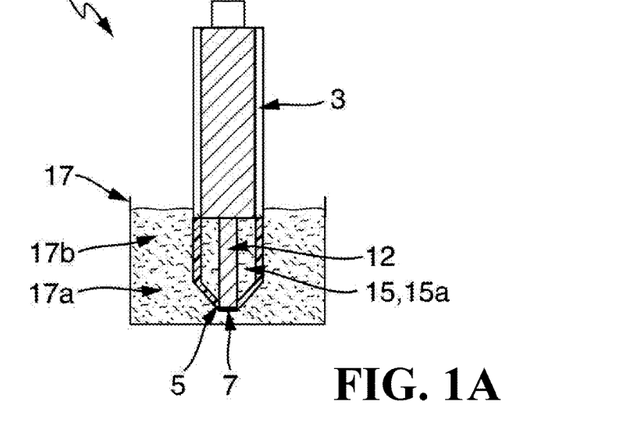
FIG. 1A shows a schematic of an electrochemical sensor according to the prior art.

FIG. 1A shows a schematic representation of an electrochemical sensor 1 for determining the concentration of an analyte 17b in a gaseous or liquid measurement medium 17a in a container 17 with a measuring electrode 7 and a second electrode 12 also called a reference electrode. The measuring electrode 7 is brought into electrolytic contact with the measurement medium 17a by means of an electrolyte chamber 15 filled with an electrolyte 15a and ending on the medium side with a membrane 5.

Figure 1B:
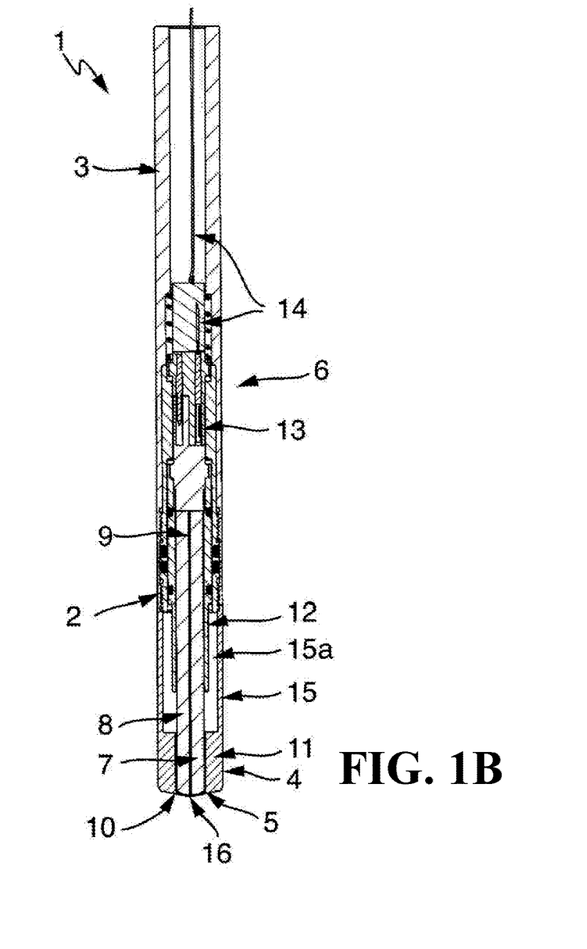
FIG. 1B shows a schematic of an electrochemical sensor according to the prior art which functions according to the amperometric principle.

In order to illustrate the design of such a sensor 1, FIG. 1B shows a representation of a longitudinal section of an amperometric sensor 1. The present disclosure is, however, in no way limited to amperometric sensors. Rather, it is used for the most varied electrochemical sensors 1 with an electrolyte 15a and/or a membrane 5.

For accommodating an electronics unit, the substantially cylindrical sensor 1 comprises a membrane module 2 arranged in a region hereafter referred to as 'on the membrane side,' a sensor shaft 3 arranged in a region hereafter referred to as 'on the connection side,' and a sensor plug head, which is connected on the connection side to the sensor shaft 3 and which is, however, not shown in FIG. 1.

The membrane module 2 comprises a membrane cap 4, inside of which a membrane 5 is pressed against the membrane cap 4 in a hermetically-sealed manner by means of a fixable sleeve. In the region on the connection side, the membrane module 2 can be removably connected to a central sensor tube 6.

The measuring electrode 7 of the sensor 1, which measuring electrode is given by, for example, an electrode 9 fused into an electrode body 8 in, for example, the form of a wire, usually forms a cathode in the case of an amperometric sensor. In the region facing the membrane 5, or the region on the membrane side, the measuring electrode 7 ends in an end face 10 for example, in the form of a spherical surface or a spherical calotte. In the region of the end face 10, the measuring electrode 7 touches the membrane 5 at least in a, for example, roughened, or structured, sub-area. An annular gap 11 remains between the measuring electrode 7 and the inner wall of the membrane cap 4, through which gap liquid can penetrate between the membrane 5 and the end face 10 of the measuring electrode 7.

In the region of the measuring electrode 7 facing away from the membrane 5, the measuring electrode 7 is surrounded by a second electrode 12, in this case the anode, which is designed in the shape of a sleeve. Both electrodes 7, 12 are, for example, connected to an electronics unit (not shown) accommodated in the sensor plug head via a plug-in connection 13 and connecting lines 14.

The membrane cap 4, the inner wall of the membrane module 2, the sensor tube 6, the second electrode 12, the measuring electrode 7, and the membrane 5 thus completely enclose an electrolyte chamber 15 inside the membrane module 2, which electrolyte chamber 15 is filled with an aqueous electrolyte solution 15a. In the annular gap 11, a thin electrolyte film forms. This region is also referred to as the measuring chamber 16. The at least partial roughening or structuring of the end face 10 ensures that the electrolyte film is of a desired and sufficient thickness. Alternatively, so-called spacers (not shown here) can also be introduced in-between.

If the electrochemical sensor 1 is, however, designed as, for example, a potentiometric sensor, e.g., for determining the concentration or partial pressure of $CO_2$ in a measurement medium, the measuring electrode comprises a pH-selective electrode, such as a pH glass electrode, or a pH-selective semiconductor electrode, such as a pH ISFET electrode. The rest of the sensor design is substantially analogous to the example shown in FIG. 1. An analyte, such as $CO_2$, diffused through the membrane 5 changes the pH value of the electrolyte 15a in the measuring chamber 16 in the case of $CO_2$, according to the equilibrium, with hydrogen carbonate (i.e., the Severinghaus principle). The pH value change is measured by means of the pH-selective electrode, and the $CO_2$ concentration of the measurement medium is determined therefrom.

Figure 2A:
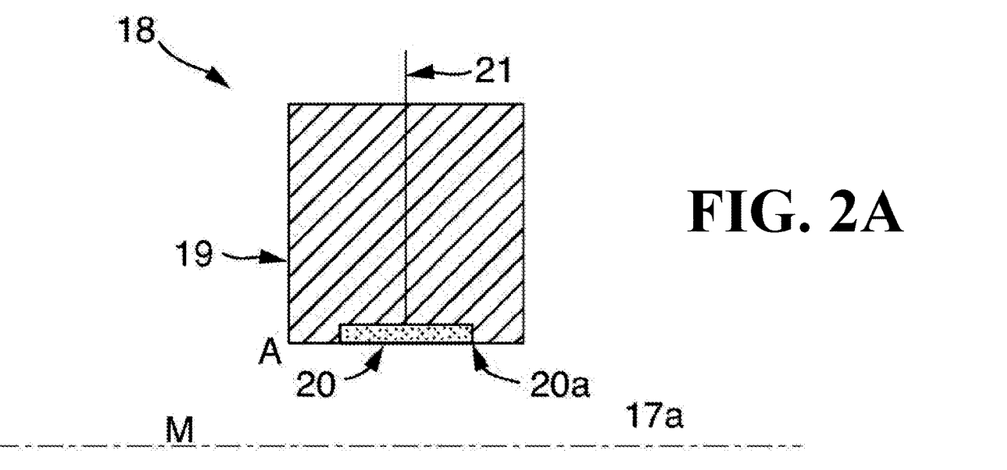
FIG. 2A shows a schematic of an embodiment of an electrode assembly according to the present disclosure with a single electrode.
Figure 2B:
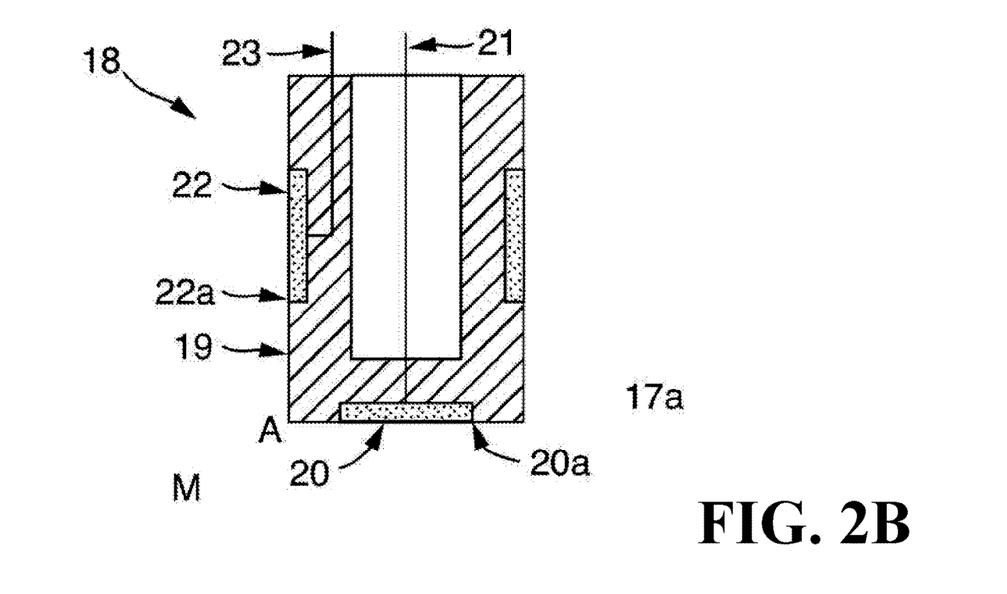
FIG. 2B shows a schematic of an embodiment of an electrode assembly according to the present disclosure with two electrodes.

According to the present disclosure, an exchangeable electrode assembly 18 is provided for an electrochemical sensor 1. Advantageous embodiments of such an electrode assembly 18 are shown in FIGS. 2A and 2B by way of example. The electrode assembly 18 comprises a sensor body 19, which is designed as a solid, cylindrical component in the case of the embodiment according to FIG. 2A. The sensor body 19 is produced from an electrically non-conductive material, such as a ceramic or a plastic. In the case where the LDS method is, for example, to be used for the production of the electrode assembly 18, the plastic is a laser-activatable plastic.

In a region M of the sensor body 19, which region is facing the respective measurement medium 17a in the installed condition in the sensor 1 (not shown in FIGS. 2A and 2B), a first electrode 20 in the form of a thin layer is applied in a first subregion 20a. Depending upon the embodiment of the sensor body 19, the electrode 20 can either end substantially flush with the bounding surface A of the sensor body 19, as shown in FIG. 2A, or protrude beyond the bounding surface, said bounding surface facing the measurement medium 17a. For the embodiment shown, the base body 19 is further provided with a first electrode assembly contacting unit 21 for electrically contacting the electrode 20, which is designed as a metallic contact feedthrough extending through the sensor body 19.

In contrast to the embodiment according to FIG. 2A, the sensor body 19 of the electrode assembly 18 of FIG. 2B is designed as a hollow body. The electrode assembly 18 of this embodiment has two electrodes 20, 22, which are respectively arranged in two subregions 20a, 22a, in the region M of the sensor body 19 facing the measurement medium 17a. The two electrodes 20 and 22 are respectively electrically contacted by means of an electrode assembly contacting unit 21 and 23, respectively.

Figure 3A:
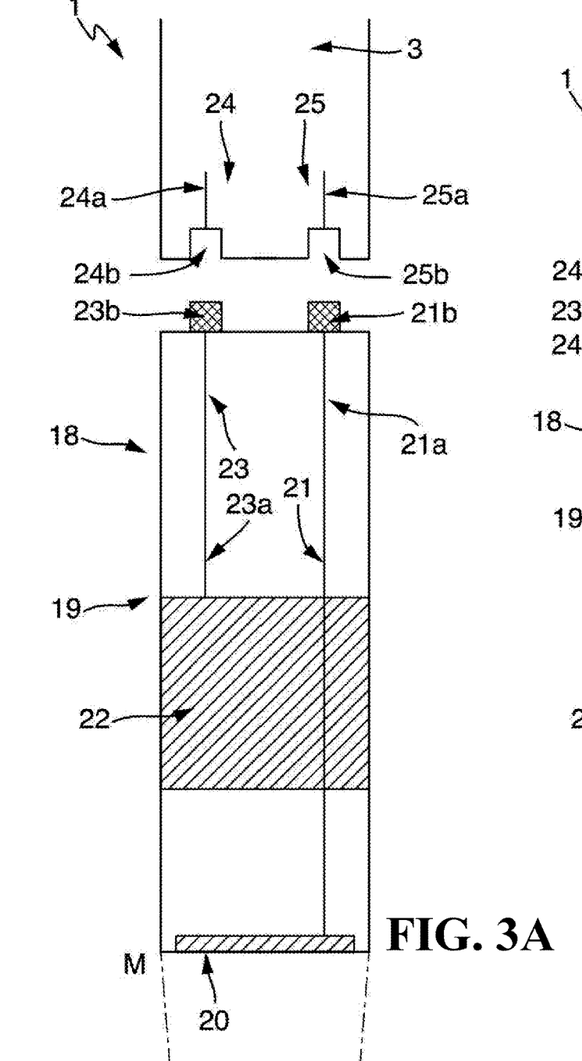
FIG. 3A shows a schematic of an embodiment of an electrode assembly according to the present disclosure with two electrodes before mounting to a sensor.
Figure 3B:
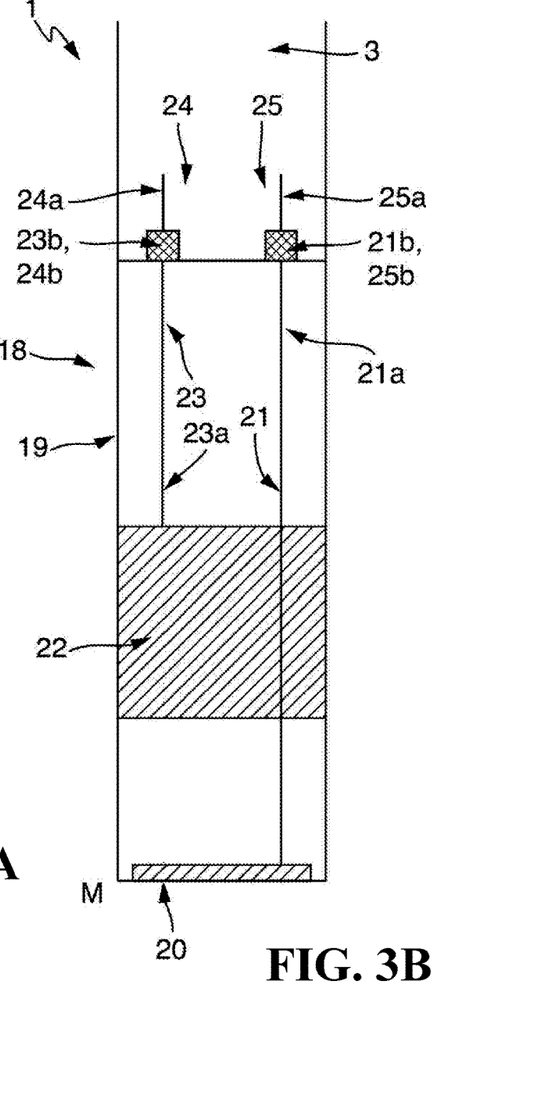
FIG. 3B shows a schematic of an embodiment of an electrode assembly according to the present disclosure with two electrodes after mounting to a sensor.

Without loss of generality, FIGS. 3A-3C and FIGS. 4A and 4B respectively relate to embodiments of the electrode assembly 18 according to the present disclosure with two electrodes 20, 22. Already explained reference symbols are therefore not necessarily discussed again in detail. The electrode assembly contacting units 21, 23 of the illustrated exemplary embodiment are respectively composed of an associated electrode assembly contact feedthrough 21a, 23a and an electrode assembly contact pin 21b, 23b. In such an embodiment, the electrochemical sensor has two sensor contacting units 24, 25 complementary to the electrode assembly contacting units 21, 23, which sensor contacting units 24, 25 are composed of sensor receptacles 24b, 25b complementary to the electrode assembly contact pins 21b, 23b for the same, as well as of two sensor contact feedthroughs 24a, 25a. As can be seen in FIG. 3B, after the electrode assembly 18 is mounted onto the sensor 1, the electrode assembly contact pins 21b, 23b protrude into the sensor receptacles 24b, 25b such that an electrical contact is established.

Figure 3C:
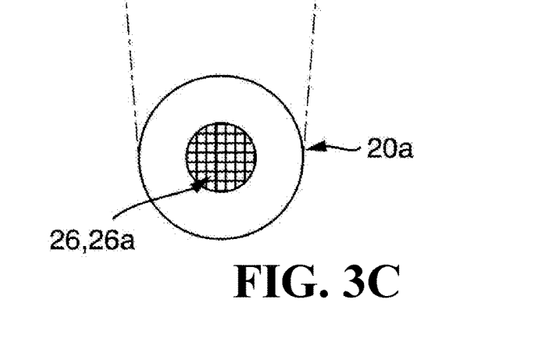
FIG. 3C shows a schematic top view of a segment of a sensor body of an embodiment of an electrode assembly according to the present disclosure.

FIG. 3C shows a schematic top view of the first subregion 20a of the sensor body 19. Into a further subregion 26, a lattice structure 26a is introduced, which serves as, for example, a spacer or placeholder between the membrane 5 and the respective electrode 20, 22 inside the measuring chamber 16.

Figure 4A:
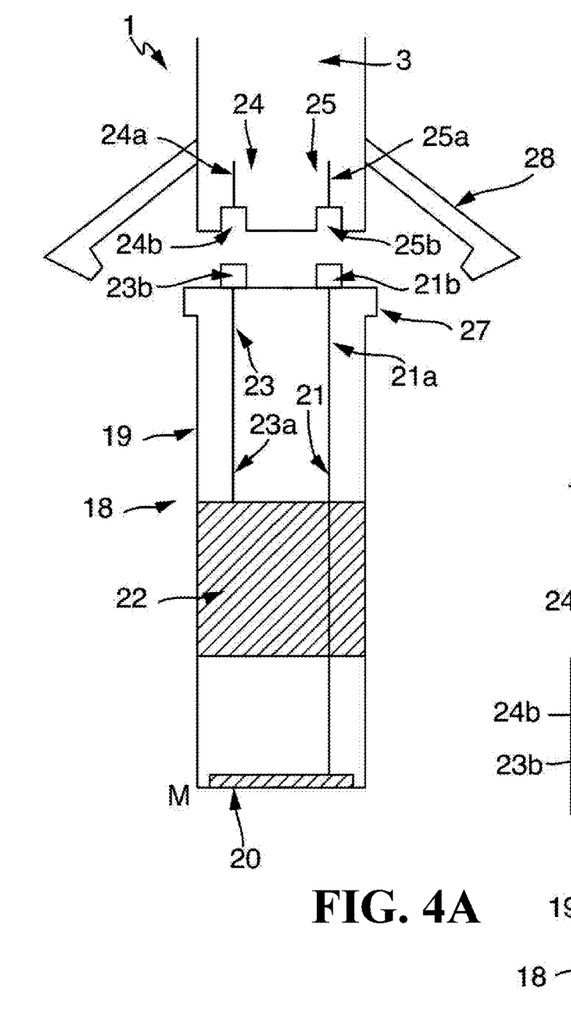
FIG. 4A shows a schematic of an electrode assembly according to the present disclosure, the electrode assembly mounted on the sensor with a mounting unit in the form of a clamp.
Figure 4B:
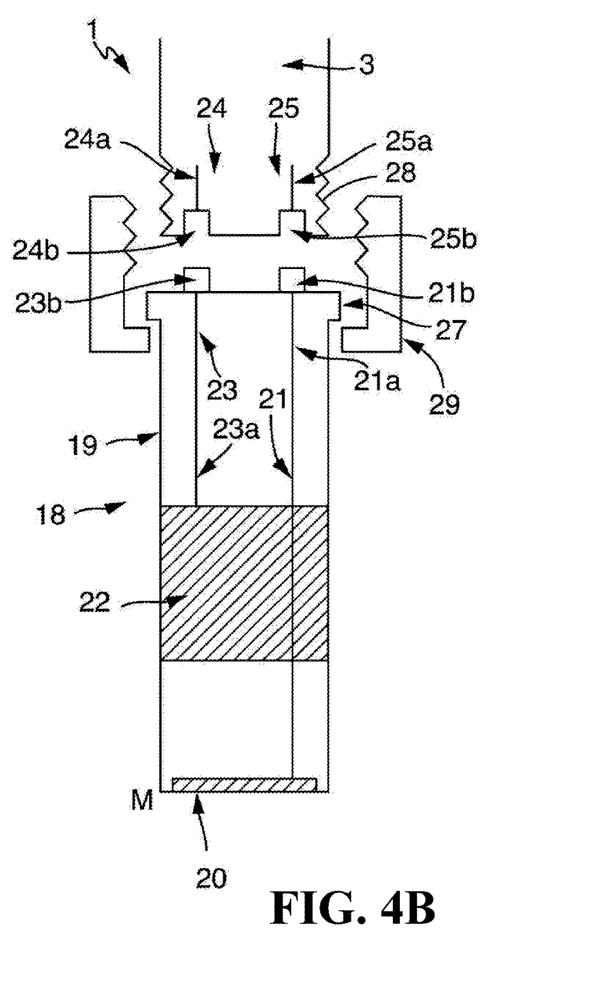
FIG. 4B shows a schematic of an electrode assembly according to the present disclosure, the electrode assembly mounted on the sensor with a mounting unit in the form of a screw connection.

FIGS. 4A and 4B show two preferred embodiments of an electrochemical sensor 1 with an electrode assembly 18 according to the present disclosure with a first mounting unit 27. A second mounting unit 28, which is designed to be complementary to the first mounting unit 27, is mounted on the sensor tube 3 of the sensor 1. By means of the first and the second mounting units 27, 28, the electrode assembly 18 can be removably mounted on the respective sensor 1 especially, on the sensor tube 3 of the sensor 1. For the embodiments shown here by way of example, the mounting is effected, according to FIG. 4A, by means of a clamping connection and, according to FIG. 4B, by means of a screw connection. In doing so, for FIG. 4A, the first mounting unit 27 is designed in the form of a clamping edge or a holder, and the second mounting unit 28 is designed in the form of a clamping device. For the screw connection according to FIG. 4B, the first mounting unit 27 is also realized in the form of a clamping edge or a holder, while the second mounting unit 28 is a thread. In order to mount the electrode assembly 18 on the sensor 1, a sleeve nut 29 is further required according to this example, which sleeve nut can either be considered a separate component or be assigned to one of the two mounting units 27, 28.

It goes without saying that all conceivable mounting methods known to the person skilled in the art are available for the mounting, which mounting methods furthermore all fall under the present disclosure. It should be pointed out that, depending upon the selected mounting method, two mounting units 27, 28 are not necessarily required, but that the mounting can possibly also be realized by means of a single mounting unit 27, 28. In particular, a mounting unit 27, 28 is, in principle, not necessarily required. For example, the electrode assembly 18 can also be mounted on the sensor 1 by means of a membrane cap 4 (not shown) of the respective sensor 1.

The invention claimed is:

1. An electrode assembly for an electrochemical sensor for determining the concentration of an analyte in a gaseous or liquid measurement medium, the electrode assembly comprising:
   a sensor body made of a plastic material doped with a laser-activatable metal compound as a plastic additive, wherein a laser is used to generate conductive metal particle seeds from the metal compound in at least a first subregion of the sensor body;

a first electrode formed by applying at least a first electrically conductive material to the first subregion of the sensor body; and a lattice structure arranged beside an exterior side of the first electrode, wherein the sensor body and lattice structure are configured to enable a membrane to be assembled thereto such that the lattice structure is disposed between the first electrode and the membrane when so assembled.

2. The electrode assembly of claim 1, the electrode assembly further comprising at least one electrode assembly contacting unit for removably and electrically connecting at least the first electrode to at least one component of the electrochemical sensor.

3. An electrochemical sensor for determining the concentration of an analyte in a gaseous or liquid measurement medium, the sensor comprising:

an electrolyte chamber at least partially filled with an electrolyte and separated from a measurement medium by a membrane; and an electrode assembly comprising:

a sensor body made of a plastic material doped with a laser-activatable metal compound as a plastic additive, wherein a laser is used to generate conductive metal particle seeds from the metal compound in at least a first subregion of the sensor body;

a first electrode of the electrode assembly formed by applying at least a first electrically conductive material to the first subregion of the sensor body, wherein the first electrode of the electrode assembly protrudes into the electrolyte chamber and at least partially contacts the electrolyte; and at least a first mounting unit for removably mounting the electrode assembly on at least one component of the electrochemical sensor.

4. The electrochemical sensor of claim 3, the sensor further comprising at least one electrode assembly contacting unit for removably and electrically connecting at least the first electrode to at least one component of the electrochemical sensor.

5. The electrochemical sensor of claim 3, the sensor further comprising a sensor housing including a second mounting unit configured to be complementary to the first mounting unit of the electrode assembly, wherein the electrode assembly is removably mountable on the sensor using the first and second mounting units.

6. The electrochemical sensor of claim 4, wherein the at least one electrode assembly contacting unit includes a second contacting unit for electrically connecting the electrode assembly to an electronics unit of the sensor.

7. The electrochemical sensor of claim 3, wherein the sensor body includes a portion having a lattice structure or a profile, and wherein the electrode assembly is arranged such that the portion faces the membrane.

* * * * *